(12) United States Patent
Zellweger et al.

(10) Patent No.: US 7,321,754 B2
(45) Date of Patent: Jan. 22, 2008

(54) RADIO-FREQUENCY SIGNAL FREQUENCY CONVERSION DEVICE FOR A LOW POWER RF RECEIVER

(75) Inventors: Emil Zellweger, Lommiswil (CH); Yves Oesch, Neuchatel (CH); Kilian Imfeld, Neuchatel (CH); Pierre-André Farine, Neuchatel (CH)

(73) Assignee: Asulab S.A., Marin (CH)

( * ) Notice: Subject to any disclaimer, the term of this patent is extended or adjusted under 35 U.S.C. 154(b) by 358 days.

(21) Appl. No.: 10/486,332

(22) PCT Filed: Aug. 1, 2002

(86) PCT No.: PCT/EP02/08566

§ 371 (c)(1),
(2), (4) Date: Feb. 10, 2004

(87) PCT Pub. No.: WO03/015259

PCT Pub. Date: Feb. 20, 2003

(65) Prior Publication Data

US 2004/0248537 A1      Dec. 9, 2004

(30) Foreign Application Priority Data

Aug. 10, 2001   (EP)   ................... 01203037

(51) Int. Cl.
*H04B 1/10* (2006.01)
(52) U.S. Cl. .................. 455/307; 455/296; 455/334; 455/339
(58) Field of Classification Search ............ 455/131, 455/427, 323, 296, 307, 334, 339, 340; 342/357.06, 342/357.12; 348/726
See application file for complete search history.

(56) References Cited

U.S. PATENT DOCUMENTS 4,445,118 A * 4/1984 Taylor et al. .......... 342/357.09

(Continued)

FOREIGN PATENT DOCUMENTS

DE      199 06 801 A1      8/1999

(Continued)

OTHER PUBLICATIONS

European Search Report (in French), completed Jan. 21, 2002, by N. Butler.

*Primary Examiner*—Lana Le
*Assistant Examiner*—April S. Guzman
(74) *Attorney, Agent, or Firm*—Griffin & Szipl, P.C.

(57)   ABSTRACT

The radio-frequency signal frequency conversion device generates intermediate complex signals (IF) for a correlation stage of a low power RF receiver. In order to do this, the device includes a first selective pass-band filter for filtering radio-frequency signals picked up by an antenna. A frequency synthesizer generates first and second high frequency signals, wherein the frequency of the first signals is higher than the frequency of the second signals. This synthesizer receives reference signals from an oscillator unit. A first mixer unit mixes the radio-frequency signals with the first signals in order to generate frequency-converted signals. A second pass-band filter filters the signals from the first mixer unit, and provides signals to a second mixer unit to mix them with the second high frequency signals. Finally, shaping means for the signals provided by the second mixer unit generate the intermediate signals. The second filter is a not very selective active filter, which is integrated, in an RF/IF integrated circuit with the first and second mixer units, the signal shaping means, and certain parts of the synthesizer and the oscillator unit.

16 Claims, 5 Drawing Sheets

U.S. PATENT DOCUMENTS

| | | | |
|---|---|---|---|
| 4,601,005 A * | 7/1986 | Kilvington | 708/3 |
| 5,293,170 A * | 3/1994 | Lorenz et al. | 342/352 |
| 5,420,592 A * | 5/1995 | Johnson | 342/357.12 |
| 5,663,734 A * | 9/1997 | Krasner | 342/357.12 |
| 5,781,155 A * | 7/1998 | Woo et al. | 342/357.06 |
| 5,905,460 A * | 5/1999 | Odagiri et al. | 342/357.06 |
| 6,061,390 A | 5/2000 | Meehan et al. | |
| 6,377,315 B1 * | 4/2002 | Carr et al. | 348/726 |
| 6,437,736 B2 * | 8/2002 | Ueda et al. | 342/357.12 |
| 6,600,911 B1 * | 7/2003 | Morishige et al. | 455/307 |
| 6,630,868 B2 * | 10/2003 | Perrott et al. | 331/17 |
| 6,725,159 B2 * | 4/2004 | Krasner | 701/213 |
| 6,839,021 B2 * | 1/2005 | Sheynblat et al. | 342/357.06 |
| 6,973,297 B1 * | 12/2005 | Manku et al. | 455/323 |
| 7,236,212 B2 * | 6/2007 | Carr et al. | 348/726 |
| 2002/0004392 A1 * | 1/2002 | Farine et al. | 455/427 |

FOREIGN PATENT DOCUMENTS

| | | |
|---|---|---|
| DE | 199 26 101 A1 | 2/2001 |
| EP | 0 445 522 A2 | 9/1991 |
| EP | 523938 A1 * | 1/1993 |
| EP | 0 678 974 A2 | 10/1995 |
| EP | 0 523 938 B1 | 10/1997 |
| WO | WO 95/30275 | 11/1995 |
| WO | 01/17120 * | 3/2001 |

* cited by examiner

RADIO-FREQUENCY SIGNAL FREQUENCY CONVERSION DEVICE FOR A LOW POWER RF RECEIVER

This is a National Phase Application in the United States of International Patent Application No. PCT/EP02/08566, filed Aug. 1, 2002, which claims priority on European Patent Application No. 01203037.5, filed Aug. 10, 2001. The entire disclosures of the above patent applications are hereby incorporated by reference.

FIELD OF THE INVENTION

The invention concerns a radio-frequency signal frequency conversion device for a low power RF receiver, in particular of the GPS type. As a function of the received radio-frequency signals, the device generates intermediate signals intended to be processed in a correlation stage of the low power RF receiver.

The invention also concerns an RF/IF integrated circuit as part of the frequency conversion device.

BACKGROUND OF THE INVENTION

The frequency conversion device includes first of all a first pass-band filter for filtering radio-frequency signals picked up by an antenna of the receiver, said first filter being a passive selective filter for eliminating image frequencies during a first frequency conversion. The device further includes means for generating oscillating signals for generating first and second high frequency signals, the frequency of the first signals being higher than the frequency of the second signals. The first high frequency signals are mixed with the filtered radio-frequency signals in a first mixer unit. The signals generated by the first mixer unit have a frequency equal to the result of a subtraction of the frequency of the first signals from a carrier frequency of the radio-frequency signals. The device further includes a second pass-band filter for filtering the signals coming from the first mixer unit and a second mixer unit for mixing the signals filtered by the second filter with the second high frequency signals. The signals generated by the second mixer unit have a frequency equal to the result of a subtraction of the frequency of the second signals from the frequency of the signals coming from the first mixer unit. Finally, the device includes means for shaping the signals provided by the second mixer unit for generating the intermediate signals.

In the case of a GPS receiver, the correlation stage has the task of extracting the GPS messages or data from the intermediate signals received from the device. The messages are transmitted to microprocessor means of the receiver for calculating the position and time-related data. Of course, the receiver has to pick up the radio-frequency signals of at least four visible satellites for the position calculation.

The frequency conversion device can also be used in any radio-frequency signal receiver other than a GPS receiver. It may for example be a receiver used in a satellite navigation system of the GLONASS or GALILEO type. It may also be a receiver used in a mobile telephone network, for example of the CDMA type (Code-division multiple access).

The use of RF receivers, particularly of the GPS type, is currently widespread. This allows a user of such a receiver to be able to take a bearing in the direction of a desired target and to find the position of his current location. Consequently, it becomes necessary to be able to incorporate an RF receiver in objects which are used daily and which a single person can easily carry.

GPS receivers can be mounted for example in a wristwatch or a mobile telephone. However, in order to be mounted in these small sized objects, the receivers have to fulfil certain conditions. On the one hand, the power consumption of low power receivers has to be greatly reduced, since the objects are powered by batteries or accumulators of small size. On the other hand, the number of components of the receiver also has to be considerably reduced.

Usually, the frequency conversion devices of RF receivers are designed to perform a triple frequency conversion of the received radio-frequency signals. An embodiment of such a device according to the prior art is shown schematically in FIG. 1.

With reference to FIG. 1, the frequency conversion device is connected to an antenna 2 of the RF receiver, particularly of the GPS type, for picking up RF signals originating from visible satellites. For civil applications, the carrier frequency of the GPS radio-frequency signals has a value of 1.57542 GHz.

The radio-frequency signals picked up by the antenna are first of all filtered and amplified by a first filtering and amplification element 101. The radio-frequency signals filtered by element 101 are then mixed in a first mixer 102 with first high frequency signals provided by a voltage-controlled oscillator 109. The signals thus generated by mixer 102 are signals whose frequency is equal to the result of a subtraction of the frequency of the first high frequency signals from the carrier frequency of the filtered radio-frequency signals.

For this first frequency conversion operation by first mixer 102, the pass-band filter of element 101 has to be a selective passive filter of the SAW type. Said filter of element 101 has to be sufficiently selective to eliminate the image frequency of the radio-frequency signals at the input of the first mixer.

With a frequency of the first high frequency signals equal, for example, to 1.3961 GHz, the frequency of the signals generated by the first mixer has a value of approximately 179.3 MHZ. Thus the first selective filter has to be capable of eliminating the image frequency having a value of 1.2168 GHz (1.3961 GHz-0.1793 GHz) from the received radio-frequency signals.

The signals generated by the first mixer 102 are filtered and amplified by a second filtering and amplification element 103. The signals filtered by element 103 are then mixed in a second mixer 104 with second high frequency signals provided by a first divider 110 connected to oscillator 109. The signals thus generated by second mixer 104 are signals whose frequency is equal to the result of a subtraction of the frequency of the second high frequency signals from the frequency of the signals generated by the first mixer.

For this second frequency conversion operation by second mixer 104, the pass-band filter of element 103 also has to be a selective passive filter in particular of the SAW type.

The first high frequency signals are divided, for example, by 8 using a first divider 110 for generating the second high frequency signals whose frequency has a value of approximately 174.5 MHz. Thus, the frequency of the signals generated by the second mixer has a value of approximately 4.8 MHz. The second selective filter thus has to be capable of eliminating the image frequency having a value of approximately 169.7 MHz (174.5 MHZ-4.8 MHZ) of the signals generated by first mixer 102.

The signals generated by second mixer 104 are then filtered and amplified by a third filtering and amplification element 105 which includes a pass-band filter. The signals filtered by third element 105 are mixed in a third mixer 106 with clock signals CLK provided by a frequency divider 115 connected to a reference oscillator 114.

The frequency of the reference signals generated by the reference oscillator has a value, for example, of 17.452 MHz. This reference frequency is divided by 4 by divider 115 to generate clock signals at the frequency of 4,363 MHz. Thus for this third conversion operation, the frequency of the signals generated by the third mixer is close to 400 kHz.

The signals generated by third mixer 106 still have to be filtered and amplified by a fourth filtering and amplification element 107, which includes a low-pass filter, and be sampled and quantified by a sample and hold converter 108. This converter 108 is clocked by clock signals CLK.

In order to generate the first and second high frequency signals, the device has a phase lock loop frequency synthesiser 100. This synthesiser includes voltage controlled oscillator 109, two frequency dividers 110 and 111, a frequency and phase detector 112 for comparing the frequency of the signals originating from oscillator 109, which are divided by dividers 110 and 111, with the frequency of the reference signals generated by reference oscillator 114. The control signals leaving detector 112 are filtered by a low-pass filter 113 in order to generate a control voltage at oscillator 109 as a function of the comparison of the signals provided to said detector 112.

A major drawback of the device of FIG. 1 is that it includes too large a number of electronic components to achieve the triple frequency conversion. A large part of the components still has to operate at high frequency. Consequently, the current consumption of the device is too high. One cannot therefore envisage mounting an RF receiver comprising the device in an object of reduced size, since said object includes a battery or accumulator of small size. This battery or accumulator would be too quickly discharged during operation of the RF receiver.

Another drawback lies in the use of at least two selective pass-band filters of the SAW type, which are expensive and bulky components. The dimensions of each encapsulated filter is of the order of 5 mm×5 mm×1.3 mm, which involves a significant loss of space for assembly in an object of small size such as a wristwatch or a cellular telephone. It should also be noted that SAW type selective filters generate a gain loss of the filtered signals which means that said signals have to be amplified for the subsequent processing operations.

In order to reduce the number of components for the frequency conversion in such a device, it has already been proposed to perform only a double frequency conversion instead, of the usual triple frequency conversion. European Patent No. EP 0 523 938 B1, which discloses a radio receiver, can be cited in this regard. Said receiver includes a frequency conversion device performing a double frequency conversion of the radio-frequency signals received at an antenna.

The frequency conversion device shown in FIG. 1 of this Patent includes a phase lock loop frequency synthesiser 30 formed mainly of a voltage controlled oscillator 28, which provides first high frequency signals to a first mixer 14. The first mixer also receives radio-frequency signals filtered and amplified by amplification and filtering element 12, which includes a selective pass-band filter. The converted signals generated by the first mixer have a frequency of the order of 200 MHz.

A second amplification and filtering element 16, which includes a selective pass-band filter, filters and amplifies the signals generated by first mixer 14 in order to provide filtered signals to a second mixer 18. This second mixer 18 also receives second high frequency signals whose frequency is an integer number times less than the frequency of the first high frequency signals. The frequency of the signals produced by the second mixer is approximately equal to 26 MHz. These signals are then filtered and amplified by a third element 20 before being provided to a processor 22.

One drawback of the device presented in this European Patent lies in the fact that it is necessary to use two selective passive filters, which can, for example, be of the SAW type. Even if the two mixers and a part of the frequency synthesiser are integrated in the same integrated circuit, the two selective filters cannot, however, be integrated in said integrated circuit. Consequently, a significant loss of space remains with the use of external filters, and the cost of making a device with these expensive components remains high.

Another drawback lies in the fact that the current consumption remains high, since a large part of the components operates at high frequency and the selective filters consume an enormous amount. Assembly of such a receiver in an object of small size cannot be easily achieved.

An object of the present invention consists in making a frequency conversion device that reduces energy consumption, as well as the number and size of electronic components as much as possible to carry out a double frequency conversion in order to overcome the drawbacks of the devices of the prior art. Thus, the RF receiver including said device can easily be mounted in an object of small size, such as a wristwatch or a cellular telephone.

SUMMARY OF THE INVENTION

This object, in addition to others, is achieved by the aforecited conversion device, which is characterised in that the second filter is a not very selective filter.

In accordance with an apparatus embodiment of the present invention, a radio-frequency signal frequency conversion device (3) for generating intermediate signals (IF) intended to be processed in a correlation stage (6) of a low power RF receiver (1) is provided, wherein the device includes: (a) a first pass-band filter (12) for filtering radio-frequency signals picked up by an antenna (2) of the receiver, said first filter being a passive selective filter for eliminating the image frequencies during a first frequency conversion; (b) oscillating signal generating means (20 to 29) for generating first and second high frequency signals, the frequency of the first signals being higher than the frequency of the second signals; (c) a first mixer unit (14) for mixing the filtered radio-frequency signals with the first high frequency signals in order to generate signals whose frequency is equal to the result of a subtraction of the frequency of the first signals from a carrier frequency of the radio-frequency signals; (d) a second pass-band filter (15) for filtering the signals originating from the first mixer unit; (e) a second mixer unit (16) for mixing the signals filtered by the second filter with the second high frequency signals in order to generate signals whose frequency is equal to the result of a subtraction of the frequency of the second signals from the frequency of the signals originating from the first mixer unit; and (f) shaping means (17, 18, 19) for the signals provided by the second mixer unit for generating the intermediate signals, wherein the device is characterised in that the second filter is a not very selective filter.

Furthermore, the above apparatus embodiment of the present invention may be modified so that the frequency of the first high frequency signals is n times higher than the frequency of the second high frequency signals, n being an integer number selected, in particular, from the range of 50 to 100, and is preferably equal to 64.

In a preferred embodiment of the device, the second filter is an active pass-band filter in which the signals generated by the first mixer unit are filtered and amplified.

In another preferred embodiment of the device, the second filter is integrated in an RF/IF integrated circuit with the first and second mixer units, the signal shaping means and certain parts of the oscillating signal generating means.

One advantage of this frequency conversion device lies in the fact that a single RF/IF integrated circuit can include the two mixer units, the second not very selective pass-band filter, the shaping means for the signals provided by the second mixer unit to generate the intermediate signals, and the majority of the oscillating signal generating means. These signal generating means include, in particular, at least one frequency synthesiser connected to an oscillator unit which provides it with reference signals. Only a low-pass filter of the synthesiser and the quartz crystal of the oscillator unit are external components to the RF/IF integrated circuit.

The number and the size of the electronic components of the frequency conversion device is thus reduced to the minimum. Outside RF/IF integrated circuit remain only the first passive selective filter of the SAW type, an amplifier for the radio-frequency signals picked up by the antenna of the receiver, the low-pass filter and the quartz crystal described hereinabove.

Another advantage is that the second pass-band filter can be integrated since it does not need to be selective. This second filter is thus called a not very selective filter. The second filter is an active filter providing amplification of the received signals, which avoids using an amplifier to increase the detection sensitivity of the radio-frequency signals. It should be noted that this second filter does not need to be selective in the same way as the first pass-band filter, since the frequency of the signals generated by the first mixer is within a margin of 50 to 100 times less than the carrier frequency of the radio-frequency signals. This frequency is, for example, of the order of 26 MHz. Thus, the interfering image frequency is included in the signal pass-band and thus does not need to be eliminated by such a selective filter.

The current consumption is greatly reduced, since only a double frequency conversion is carried out with a second not very selective low power-consuming filter. Moreover, the majority of the components operates at a lower frequency than the frequency conversion device of the prior art.

The object, in addition to others, is also achieved by the RF/IF integrated circuit for a frequency conversion device characterised in that it includes the first mixer unit, the second pass-band filter, the second mixer unit, the shaping means and the majority of the oscillating signal generating means.

For the purposes of reducing the power consumption and size of the device's electronic components, the RF/IF integrated circuit can be made in CMOS technology of 0.25 μm or less. However, it could also be envisaged to make it in biCMOS or bipolar technology, or even with CMOS technology greater than 0.25 μm.

BRIEF DESCRIPTION OF THE DRAWINGS

The objects, advantages and features of the radio-frequency signal frequency conversion device for an RF receiver will appear more clearly in the following description of at least one embodiment illustrated by the drawings, in which.

DETAILED DESCRIPTION OF THE ILLUSTRATIVE EMBODIMENTS

In the following description, those elements of the frequency conversion device for a low power RF receiver, which are well known to those skilled in the art in this technical field, are only related in a simplified manner. Moreover, reference will only be made to a device for a low power GPS type receiver, even if the device can of course be used in any other type of RF receiver.

Figure 2:
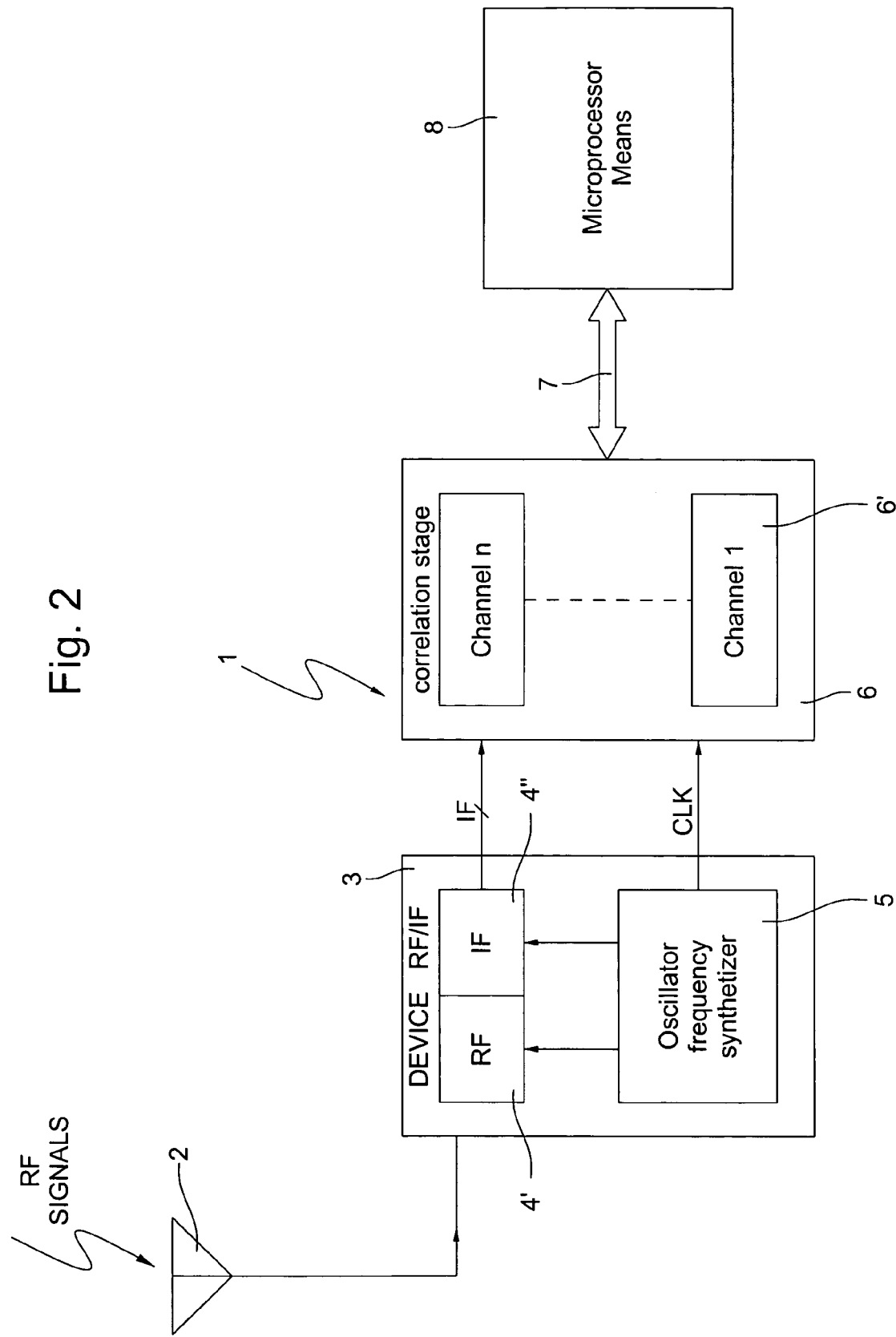
FIG. 2 shows schematically the various parts forming a radio-frequency signal receiver.

Referring to FIG. 2, a radio-frequency signal receiver 1 is schematically shown. Said receiver 1 includes an antenna 2 for picking up RF signals originating in particular from visible satellites to search and to track. In the case of a GPS receiver, it is necessary that at least four visible satellites are tracked so that the receiver can extract the GPS data for the calculation of the position or the speed.

The RF receiver includes a frequency conversion device 3, called the RF/IF device in FIG. 2, directly connected to antenna 2 to receive the radio-frequency signals. Frequency conversion device 3 has the task of lowering the carrier frequency of the received radio-frequency signals via a double frequency conversion in the RF and IF circuits 4' and 4". The frequency conversion in circuits 4' and 4" is achieved as a result of oscillating signal control means 5. These means 5 include, in particular, a reference oscillator unit and a frequency synthesiser. The elements forming said device forming the subject of the invention will be explained in more detail hereinafter with reference to FIG. 3.

Device 3 provides intermediate complex IF signals which are sampled and quantified in a correlation stage 6, which is formed of several correlation channels 6'. Channels 6' operated in the correlation stage will extract the GPS data owing to the correlation steps. Each channel 6' will generate a replica of the specific pseudo-random code of the satellite to be tracked to correlate with the intermediate complex IF signals. Moreover, each channel also generates a replica of the carrier frequency to be correlated with the intermediate IF signals. Thus, as soon as each channel is locked onto the tracked satellite, it can transmit the GPS messages via a data bus 7 to microprocessor means 8. These microprocessor means 8 will thus receive the GPS data from at least four operating channels to be able to calculate position, speed and time-related data.

It should be noted that the intermediate IF signals are preferably, in complex form, formed of an in-phase signal component I and a quarter-phase signal component Q at a frequency of the order of 400 kHz. The intermediate complex IF signals are represented in FIG. 2 by a line intersected by an oblique bar defining 2 bits. It is also possible for the in-phase signals and the quarter-phase signals to each be defined by 2 bits.

The low power GPS receiver can be fitted to a portable object, such as a wristwatch in order to provide, as required, position, speed and local time data to the person wearing the watch. Since the watch has an accumulator or battery of small size, the power consumed has to be as low as possible during operation of the GPS receiver.

Of course, the GPS receiver could be fitted to other low consuming portable objects of small size, such as portable telephones, which are also fitted with an energy accumulator or a battery.

Figure 3:
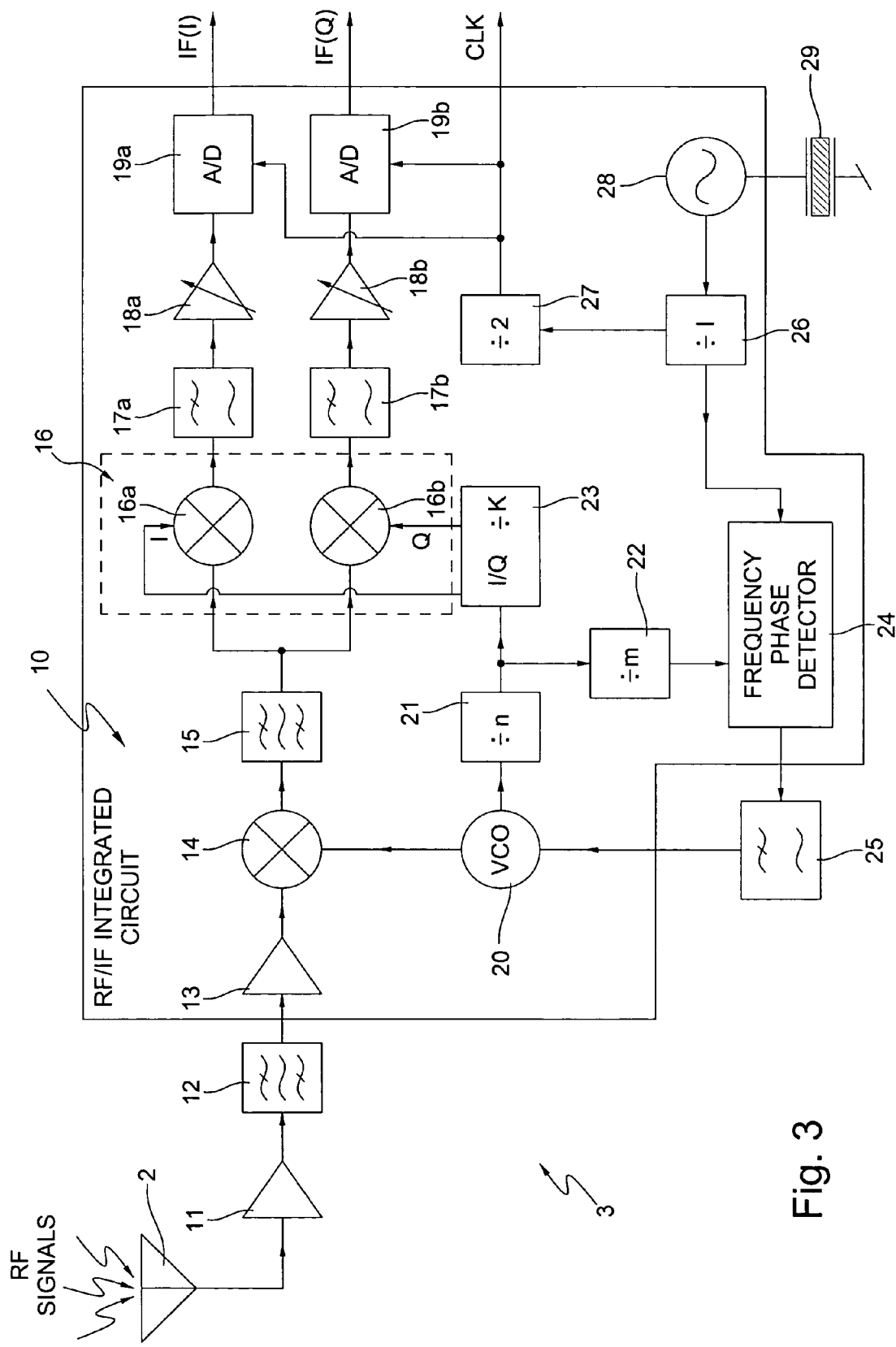
FIG. 3 shows a radio-frequency signal frequency conversion device according to the invention.

With reference to FIG. 3, a preferred embodiment of frequency conversion device 3, forming the subject of the invention, will now be described, which is connected to an antenna 2 for receiving radio-frequency signals. For civil applications, the carrier frequency of GPS radio-frequency signals has a value of 1.57542 GHz.

Device 3 includes first of all a first low noise type amplifier or LNA 11, followed by a selective pass-band Surface Acoustic Wave (SAW) filter 12. The output of filter 12 is connected to an RF/IF integrated circuit 10 intended to carry out a double frequency conversion of the filtered radio-frequency signals to generate sampled and quantified intermediate signals IF(I) and IF(Q).

As can be seen, the number of external components to the RF/IF integrated is reduced to a minimum in order to allow enough place for assembly in a wristwatch or cellular telephone. Moreover, integrated circuit 10 can be made in a semiconductor material, such as silicon, by CMOS technology of 0.25 µm for example. This allows a significant number of electronic components to be integrated while also guaranteeing a reduction in electric power consumption.

The RF/IF integrated circuit 10 of frequency conversion device 3 thus receives filtered and amplified radio-frequency signals. A pre-amplifier 13 at the input of the RF/IF circuit allows the sensitivity of the integrated circuit to be increased to process the radio-frequency signals. In a first frequency conversion operation, the outgoing radio-frequency signals from pre-amplifier 13 are mixed in a first mixer unit 14 with first high frequency signals. The first high frequency signals are provided by a voltage-controlled oscillator VCO 20 forming part of a frequency synthesiser on the basis of reference signals provided by an oscillator unit 26 and 28. Mixer unit 14 is only formed, in this embodiment, of a single mixer 14.

The signals thus generated by mixer 14 are signals whose frequency is equal to the result of a subtraction of the frequency of the first high frequency signals from the carrier frequency of the filtered radio-frequency signals. By way of non-limiting numerical example, the carrier frequency of the radio-frequency signals has a value of 1.57542 GHz, whereas the first high frequency signals are fixed to have a value of 1.5508 GHz. The frequency of the signals produced by first mixer 14 thus have a value of 24.6 MHz which is thus approximately 64 times less than the radio-frequency signal carrier frequency. However, it is entirely possible to envisage having a signal frequency situated within a margin of 50 to 100 times less than that of the radio-frequency signals.

For this first frequency conversion operation by first mixer 14, the first pass-band filter 12 has to be a selective passive filter, in particular of the SAW type. Said filter 12 has to be sufficiently selective to eliminate the image frequency of the radio-frequency signals at the input of first mixer 14.

With a frequency of the first high frequency signals equal, for example, to 1.5508 GHz, the frequency of the signals generated by the first mixer has a value of approximately 24.6 MHz. Thus the first selective filter has to be capable of eliminating the image frequency having a value of 1.5262 GHz (1.5508 GHz-0.0246 GHz) of the received radio-frequency signals.

The signals produced by first mixer 14 are filtered and amplified by a second active pass-band filter 15. This second pass-band filter does not need to be selective like first filter 12, since the interfering image frequency of the signals is included within the pass-band of the GPS signals (24.6 MHZ±1 MHz). This filter 15 can thus advantageously be integrated in the RF/IF integrated circuit. The only restriction of this filter is that it has to be capable of removing the harmonic frequency of 24.6 MHz, which is thus close to 49 MHz.

The second active pass-band filter may be well known filter by the name of IFA-gmC. This filter has the advantage of amplifying the signals generated by the first mixer around the frequency of 24.6 MHz, which is not the case of the passive selective filters. By way of illustration, reference can be made to FIGS. 4 and 5, which show graphs of the gain as a function of the signal frequency for each type of filter.

Figure 1:
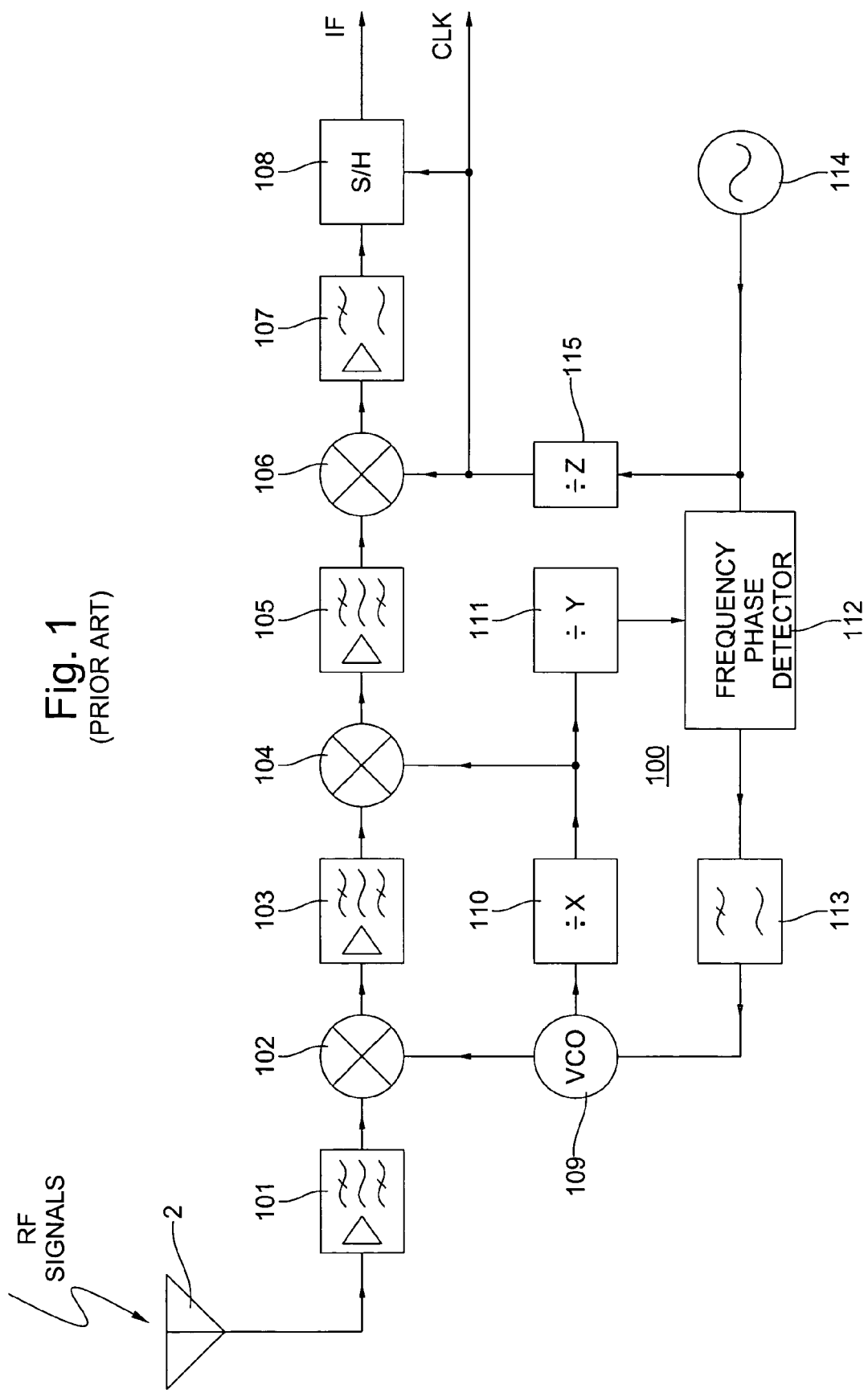
FIG. 1 described hereinbefore shows a radio-frequency signal frequency conversion device according to the prior art.
Figure 4A:
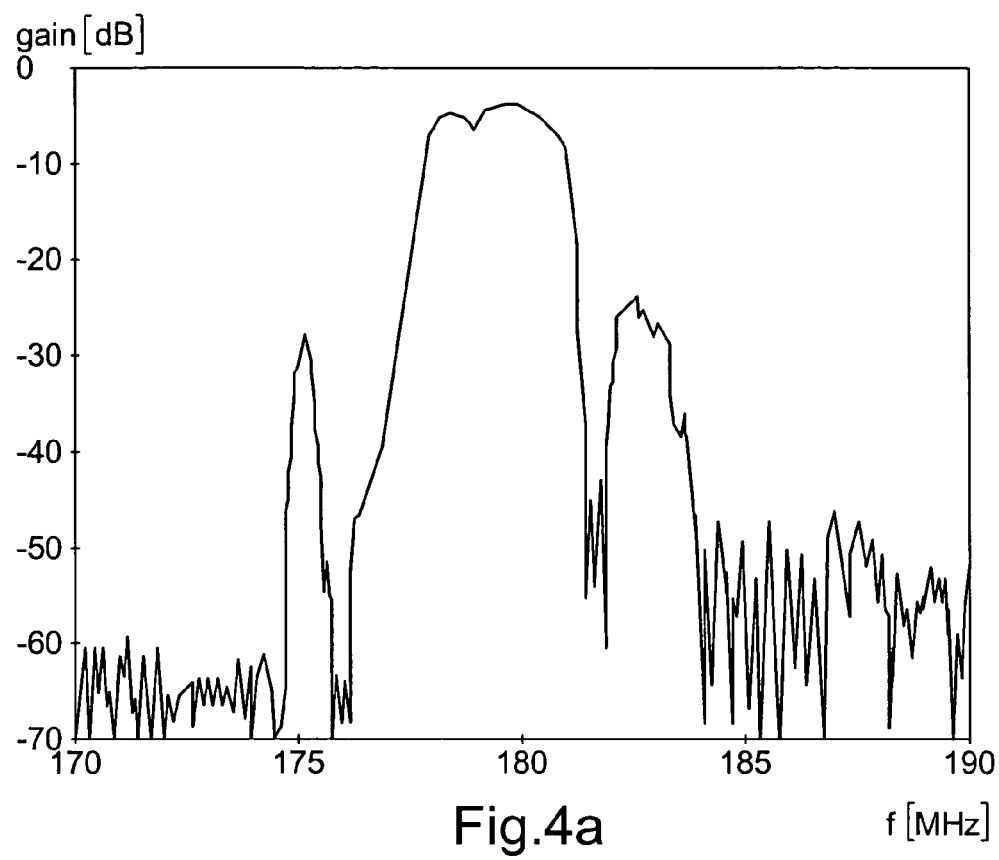
FIGS. 4a and 4b show graphs of the gain of the signals filtered by a second external passive filter as a function of the frequency of the filtered signals.
Figure 4B:
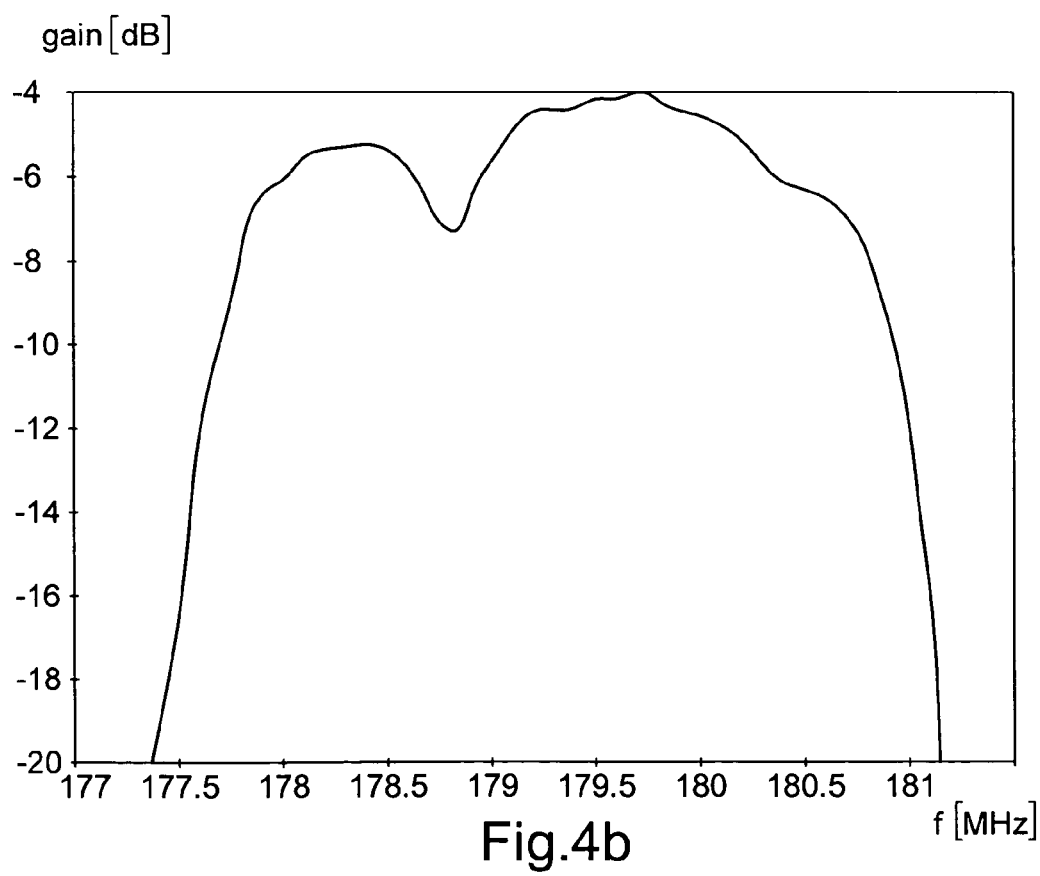

FIGS. 4a and 4b show the gain curve of the signals filtered in a SAW type selective filter around the frequency of 179 MHz cited by way of example in FIG. 1. In this case, the filter had to remove the image frequency 169.7 MHz at the input of a mixer having to generate signals at a frequency of 4.8 MHz. It will be noted that there is a loss of at least 4 dB on the filtered signals around 179 MHz, which is a drawback.

It would also have been possible to show the gain curve of the first pass-band filter of the device according to the invention. Thus, this first selective filter has to be configured to remove the image frequency of 1.5262 MHz. The complexity of such a selective filter is clear from the shape of the gain curve. This filter is thus expensive and bulky, which is why the frequency conversion device only includes one.

Figure 5:
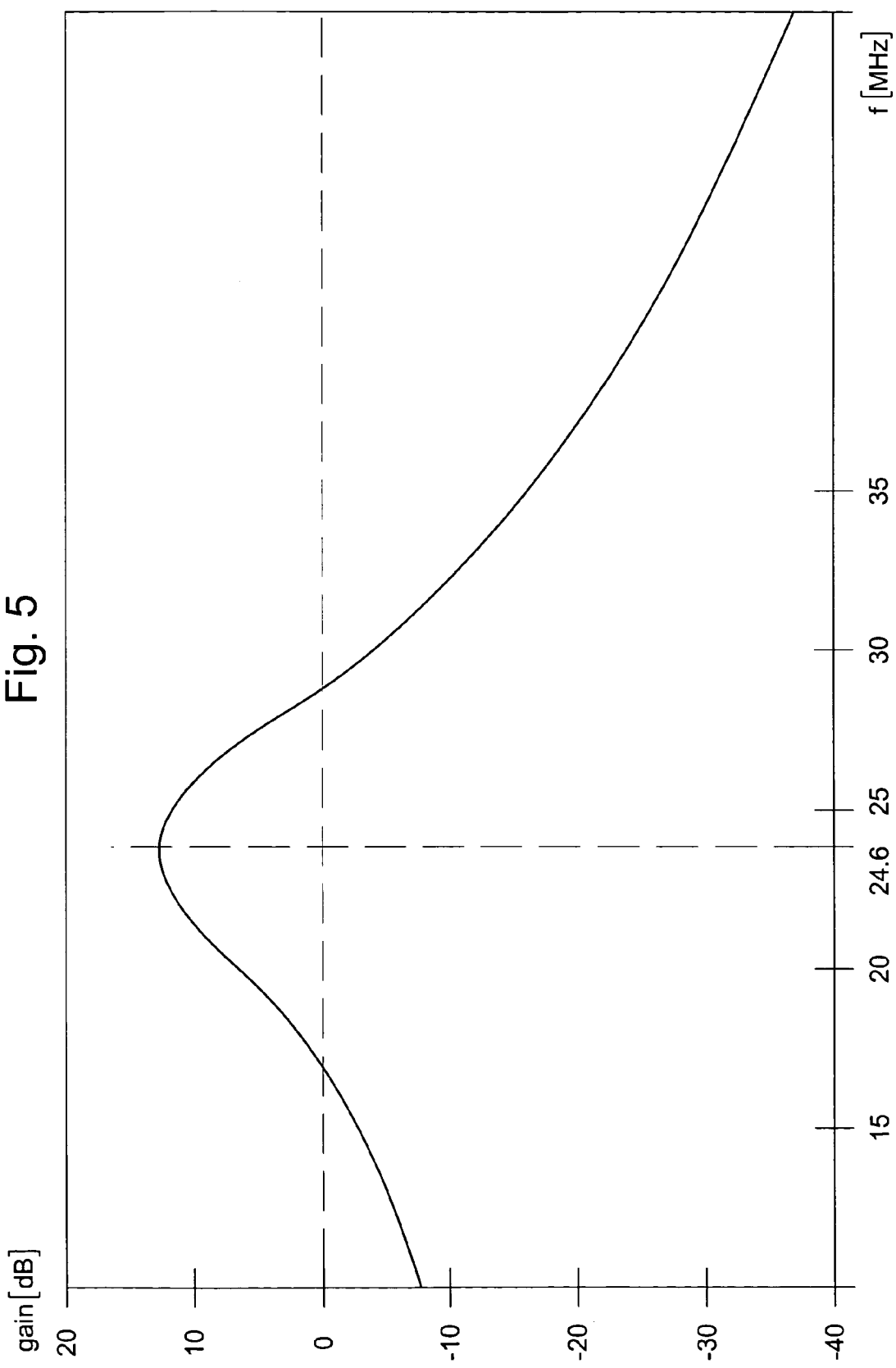
FIG. 5 shows a graph of the gain of the second integrated filter according to the invention as a function of the filtered signal frequency.

FIG. 5 shows the gain curve of the signals filtered by the second active pass-band filter integrated in the RF/IF integrated circuit around the frequency of 24.6 MHz. As can be seen in FIG. 5, the filter is not selective since the attenuation slope around the frequency of 24.6 MHz is not steep. This filter must thus be capable of removing the signals having the harmonic frequency of 49 MHz.

With reference again to FIG. 3, second filter 15 is followed by a second mixer unit 16 for the second frequency conversion. This mixer unit 16 is formed of two mixers 16a and 16b. In mixer 16a, second high frequency in-phase signals I are mixed with the signals filtered by the second filter 15. In mixer 16b, second high frequency quarter-phase signals Q are mixed with the signals filtered by second filter 15.

The second high frequency in-phase and quarter-phase signals are provided by a divider register element 23 of the frequency synthesiser. This register 23 receives signals from a first divider 21 connected to voltage-controlled oscillator 20. By way of non-limiting numerical example, first divider 21 carries out a frequency division by 32, whereas divider register 23 carries out a division by 2. If the frequency of the first high frequency signals has a value of 1,5508 GHz, this gives a frequency of 24.2 MHz of the second high frequency in-phase and quarter-phase signals.

The signals generated by mixers 16a and 16b are signals whose frequency is equal to the result of a subtraction of the frequency of the second high frequency signals from the frequency of the signals generated by the first mixer. The signals generated by each of mixers 16a and 16b have a frequency of close to 400 kHz.

Signal shaping means are placed at the output of mixers 16a and 16b. These means include after each mixer a low-pass filter (1.5 MHz) 17a and 17b, a controlled gain amplifier 18a and 18b and finally an analogue/digital converter 19a and 19b. Thus sampled and quantified intermediate complex signals IF(I) and IF(Q) are generated by frequency conversion device 3.

Each amplifier 18a and 18b can be controlled, in order to adjust the signal amplification, by a level detector integrated in the RF/IF circuit or by a correlator of the correlation stage, which receives the intermediate complex signals.

Each converter 19a and 19b is clocked by clock signals CLK provided by the oscillator unit. The reference oscillator unit thus includes an oscillator 28 with a quartz crystal 29 providing reference signals through an oscillator divider 26. The frequency of the signals provided by the oscillator is fixed, for example, at 16.154 MHz. The oscillator divider 26 divides the signals by 2 for example, which gives the reference signals at the frequency of 8.08 MHz. In order to obtain the clock signals at 4.04 MHz, the frequency of the reference signals is divided by 2 in a divider 27. These clock signals CLK are also provided to the correlation stage connected to the frequency conversion device, as well as to the microprocessor means. However, said microprocessor means can also be clocked by the reference signals of the reference oscillator unit.

The frequency conversion device includes a phase lock loop frequency, synthesiser partially described hereinbefore, for generating the first and second high frequency signals. This synthesiser includes voltage controlled oscillator 20, two frequency dividers 21 and 22, a frequency and phase detector 24 and a low-pass filter 25. The phase and frequency detector compares the frequency of the signals originating from oscillator 20, which are divided by dividers 21 and 22, with the frequency of the reference signals generated by the reference oscillator unit. The control signals leaving detector 24 are filtered by a low-pass filter 25 external to the RF/IF integrated circuit in order to generate a control voltage at oscillator 20 as a function of the comparison of the signals provided to said detector 24.

The power consumed with the configuration of the device described hereinbefore is much lower than 30 mW, close to 20 mW. The integration of the second filter in the RF/IF integrated circuit, as well as the double frequency conversion guarantees that an RF receiver including the device can be easily mounted in a portable object with a battery or accumulator of small size.

From the description that has just been given of multiple variants of the frequency conversion device for a low power receiver, in particular of the GPS type, can be conceived without departing from the scope of the invention defined by the claims.

The invention claimed is:

1. A radio-frequency signal frequency conversion device for generating intermediate signals intended to be processed in a correlation stage of a low power RF receiver of GPS type wherein the device is adapted to be mounted in a portable small sized object, the device including:
    a first pass-band filter for filtering radio-frequency signals picked up by an antenna of the receiver, said first filter is a passive selective filter of the SAW type that is sufficiently selective to eliminate image frequencies during a first frequency conversion from received radio-frequency signals;
    oscillating signal generating means for generating first and second high frequency signals, the frequency of the first signals is higher than the frequency of the second signals, wherein the oscillating signal generating means includes a reference oscillator comprising a quartz crystal;
    a first mixer unit for mixing filtered radio-frequency signals with the first high frequency signals in order to generate signals whose frequency is equal to the result of a subtraction of the frequency of the first signals from a carrier frequency of the radio-frequency signals;
    a second pass-band filter for filtering signals originating from the first mixer unit;
    a second mixer unit for mixing signals filtered by the second filter with the second high frequency signals in order to generate signals whose frequency is equal to the result of a subtraction of the frequency of the second signals from the frequency of the signals originating from the first mixer unit; and
    shaping means for signals provided by the second mixer unit for generating the intermediate signals;
    wherein the second filter is a not very selective active filter operable to remove a harmonic frequency because an attenuation slope of the second filter around a first frequency is not steep so that the active filter is capable of removing the harmonic frequency, and
    wherein the second filter is integrated in an RF/IF integrated circuit with the first mixer unit, the second mixer unit, the signal shaping means, and the oscillating signal generating means with the exception of a control signal filtering low-pass filter for a voltage controlled oscillator of a frequency synthesizer and the quartz crystal of the reference oscillator unit of the oscillating signal generating means.

2. The device according to claim 1, wherein the portable small sized object is a wristwatch and wherein the second active filter filters and amplifies signals generated by the first mixer unit.

3. The device according to claim 1, wherein the frequency of the signals generated by the first mixer unit is within a margin of 50 to 100 times less than a carrier frequency of the radio-frequency signals.

4. The device according to claim 1, wherein the frequency of the first high frequency signals is n times higher than the frequency of the second high frequency signals, n being an integer number selected from the range of 50 to 100.

5. The device according to claim 1, wherein the oscillating signal generating means includes the reference oscillator unit and a frequency synthesiser connected to the reference oscillator unit, said synthesiser providing the first and second high frequency signals on the basis of reference signals provided by the reference oscillator unit.

6. The device according to claim 5, wherein all the frequency synthesiser elements, including a phase lock loop, are integrated in the RF/IF integrated circuit with the exception of the control signal filtering low-pass filter for a voltage controlled oscillator, wherein the oscillator is operable to generate the first high frequency signals.

7. The device according to claim 5, wherein the oscillator unit provides reference signals whose frequency is determined by a quartz crystal and is situated between 10 and 20 MHz.

8. The device according to claim 1, wherein the oscillating signal generating means includes the reference oscillator unit and a frequency synthesiser connected to the reference oscillator unit, said synthesiser providing the first high frequency signals on the basis of reference signals provided by the reference oscillator unit and the reference oscillator unit providing the second high frequency signals.

9. The device according to claim 1, wherein the second high frequency signals are formed of second in-phase signals and second quarter-phase signals, and wherein the second mixer unit includes a first mixer for mixing the signals originating from the first mixer unit with the second in-phase signals and a second mixer for mixing the signals originating from the first mixer unit with the second quarter-phase signals, the shaping means receiving the signals from the first and second mixers to provide intermediate complex signals formed of in-phase signals and quarter-phase signals.

10. The device according to claim 9, wherein the shaping means includes, after each mixer of the second mixer unit, a low-pass filter followed by a controlled gain amplifier and an analogue/digital converter clocked by clock signals provided by the oscillator unit, wherein one of the converters provides the in-phase signals of sampled and quantified intermediate signals, and the other converter provides the quarter-phase signals of sampled and quantified intermediate signals.

11. An RF/IF integrated circuit for a device according to claim 1, wherein the RF/IF integrated circuit includes
the first mixer unit;
the second active pass-band filter that is not very selective and operates to remove the harmonic frequency different from the first frequency whereas the first passive filter of the SAW type operates to eliminate image frequencies during a first frequency conversion from received radio-frequency signals;
the second mixer unit;
the shaping means; and
the oscillating signal generating means with the exception of a control signal filtering low-pass filter for a voltage controlled oscillator of a frequency synthesiser and the quartz crystal of the reference oscillator unit.

12. The RF/IF integrated circuit according to claim 11, wherein the RF/IF integrated circuit is made in a semiconductor material, and in a CMOS technology of 0.25 μm or less.

13. The RF/IF integrated circuit according to claim 11, wherein the semiconductor material is silicon.

14. The device according to claim 1, wherein the frequency of the signals generated by the first mixer unit is 64 times less than a carrier frequency of the radio-frequency signals.

15. The device according to claim 1, wherein the frequency of the first high frequency signals is n times higher than the frequency of the second high frequency signals, n being an integer number equal to 64.

16. The device according to claim 1, wherein the second active filter filters and amplifies signals generated by the first mixer unit.

* * * * *